United States Patent
Lee et al.

(10) Patent No.: US 9,190,155 B2
(45) Date of Patent: Nov. 17, 2015

(54) MEMORY SYSTEM

(71) Applicant: SAMSUNG ELECTRONICS CO., LTD., Suwon-si, Gyeonggi-do (KR)

(72) Inventors: Joon-Ho Lee, Hwaseong-si (KR);
Jong-Nam Baek, Hwaseong-si (KR);
Dong-Hoon Ham, Hwaseong-si (KR);
Sang-Wook Yoo, Seongnam-si (KR);
In-Tae Hwang, Suwon-si (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 15 days.

(21) Appl. No.: 14/155,960

(22) Filed: Jan. 15, 2014

(65) Prior Publication Data

US 2014/0204672 A1 Jul. 24, 2014

(30) Foreign Application Priority Data

Jan. 21, 2013 (KR) ........................ 10-2013-0006567

(51) Int. Cl.
*G11C 16/06* (2006.01)
*G11C 16/16* (2006.01)
*G11C 16/04* (2006.01)

(52) U.S. Cl.
CPC ............ *G11C 16/16* (2013.01); *G11C 16/0483* (2013.01)

(58) Field of Classification Search
CPC ............ G06F 12/0246; G06F 12/0238; G06F 2212/2022; G06F 11/1068; G06F 3/0679; G06F 12/0866; G06F 2212/2024; G06F 11/1048; G11C 16/102; G11C 16/105; G11C 2211/5646; G11C 16/16
USPC ............ 365/185.02, 185.04, 185.29, 185.08, 365/189.14
See application file for complete search history.

(56) References Cited

U.S. PATENT DOCUMENTS

| | | |
|---|---|---|
| 2006/0256623 A1 | 11/2006 | Roohparvar |
| 2007/0011581 A1* | 1/2007 | Nakanishi et al. ............ 714/768 |
| 2011/0140068 A1 | 6/2011 | Ozawa et al. |
| 2011/0199813 A1 | 8/2011 | Yoo et al. |
| 2012/0061637 A1 | 3/2012 | Cai et al. |
| 2012/0112156 A1 | 5/2012 | Park et al. |

FOREIGN PATENT DOCUMENTS

| | | |
|---|---|---|
| JP | 2010-251479 | 11/2010 |
| JP | 2012-028590 | 2/2012 |
| JP | 2012-074542 | 4/2012 |
| KR | 1020120073435 | 7/2012 |

* cited by examiner

Primary Examiner — Thong Q Le
(74) Attorney, Agent, or Firm — F. Chau & Associates, LLC

(57) ABSTRACT

A memory system includes a flash memory including a block having first sub-blocks and second sub-blocks different from each other, the second sub-blocks including free pages only; and a controller configured to erase the flash memory in units of the sub-blocks, and in a garbage collection operation, the controller is configured to copy data of a valid page of the first sub-blocks to at least one of the second sub-blocks.

15 Claims, 10 Drawing Sheets

MEMORY SYSTEM

CROSS-REFERENCE TO RELATED APPLICATION

This application claims priority under 35 U.S.C. §119 to Korean Patent Application No. 10-2013-0006567 filed on Jan. 21, 2013 in the Korean Intellectual Property Office, the disclosure of which is incorporated by reference herein in its entirety.

BACKGROUND

1. Technical Field

The present inventive concept relates to a memory system.

2. Discussion of the Related Art

Memory devices may be classified as volatile memory devices and nonvolatile memory devices. The volatile memory devices lose stored data in the absence of power. The volatile memory devices include static random access memories (SRAMs), dynamic RAMs (DRAMs) and a synchronous DRAM (SDRAM), for example. The nonvolatile memory devices retain stored data in the absence of power. The nonvolatile memory devices include a flash memory, a read only memory (ROM), programmable ROMs (PROMs), electrically erasable and programmable ROMs (EEPROMs), resistive memories (e.g., phase-change RAM (PRAM), ferroelectric RAM (FRAM), resistive RAM (RRAM), etc., for example.

If the size of a flash memory block increases (for example, if 2 Kbytes are stored in a page), an execution time of a full block merge is increased. In particular, in a memory system having a time-out, the frequency of performing a merge operation may increase. In addition, at the same density, as a block size increases, the number of blocks is reduced, and thus, the number of free blocks that can be controlled by a controller is reduced. As a consequence, write performance of the flash memory may be lowered, and block operation may be adversely impacted.

SUMMARY

The present inventive concept provides a memory system, which can efficiently manage a storage space of a flash memory.

According to an exemplary embodiment of the present inventive concept, there is provided a memory system including a flash memory including a block having first sub-blocks and second sub-blocks different from each other, the second sub-blocks including free pages only, and a controller configured to erase the flash memory in units of the sub-blocks, and in a garbage collection operation, the controller is configured to copy data of a valid page of the first sub-blocks to at least one of the second sub-blocks.

If the number of the second sub-blocks is smaller than a reference number, the garbage collection operation is performed.

The block has a first area including the first sub-blocks and a second area including the second sub-blocks, and the controller is configured to write metadata to the first area by incorporating the second sub-block having the data of the valid page copied thereto into the first area.

The controller is configured to erase the first sub-block having the data of the valid page copied therefrom after that data is copied.

The block has a first area including the first sub-blocks and a second area including the second sub-blocks, and the controller is configured to write metadata by incorporating the erased first sub-block into the second area.

Each of the first sub-blocks or each of the second sub-blocks includes at least one page.

The first sub-blocks are provided to a file system and the second sub-blocks are not provided to the file system.

According to an exemplary embodiment of the present inventive concept, there is provided a memory system including a flash memory including a plurality of blocks, and a controller configured to store data in the flash memory, wherein at least one of the plurality of blocks includes a first area provided to a file system and a second area not provided to the file system.

The first area includes first sub-blocks including valid pages and invalid pages, and the second area includes second sub-blocks including free pages only.

The controller is configured to copy data of at least one of the valid pages to at least one of the second sub-blocks to perform garbage collection.

If the number of the second sub-blocks is smaller than a reference number, the garbage collection is performed.

The controller is configured to copy the data of the at least one valid page to the at least one second sub-block and then erase the first sub-block that had the data of the at least one valid page copied therefrom.

The controller is configured to write metadata to the first area by incorporating the second sub-block having the data of the valid page copied thereto into the first area and incorporating the erased first sub-block into the second area.

Each of the first sub-blocks or each of the second sub-blocks includes at least one page.

The controller is configured to erase the flash memory in units of at least one page.

According to an exemplary embodiment of the present inventive concept, there is provided a memory system including a flash memory including first sub-blocks and second sub-blocks, at least one of the first sub-blocks including valid and invalid pages and at least one of the second sub-blocks includes free pages only; and a controller configured to copy data of a valid page of at least one of the first sub-blocks to the at least one second sub-block in a garbage collection operation, The at least one first sub-block is erased after the data is copied therefrom.

The first sub-blocks each include a plurality of pages, or the second sub-blocks each include a plurality of pages.

The first sub-blocks are part of a user area and the second sub-blocks are part of a reserved area.

The controller is configured to incorporate that at least one second sub-block into the user area and the at least one first sub-block into the reserved area.

BRIEF DESCRIPTION OF THE DRAWINGS

The above and other features of the present inventive concept will become more apparent by describing in detail exemplary embodiments thereof with reference to the attached drawings in which.

DETAILED DESCRIPTION OF THE EMBODIMENTS

Exemplary embodiments of the present inventive concept will now be described more fully hereinafter with reference to the accompanying drawings. This inventive concept may, however, be embodied in different forms and should not be construed as limited to the embodiments set forth herein. The same reference numbers may indicate the same elements throughout the specification and drawings.

As used herein, the singular forms "a," "an" and "the" are intended to include the plural forms as well, unless the context clearly indicates otherwise.

Figure 1:
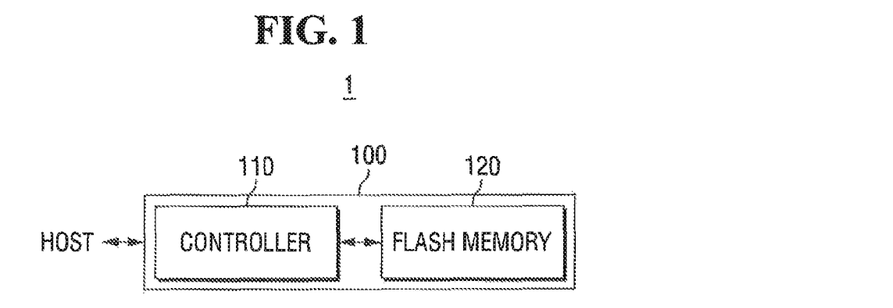
FIG. 1 is a block diagram illustrating a memory system according to an exemplary embodiment of the present inventive concept.
Figure 2:
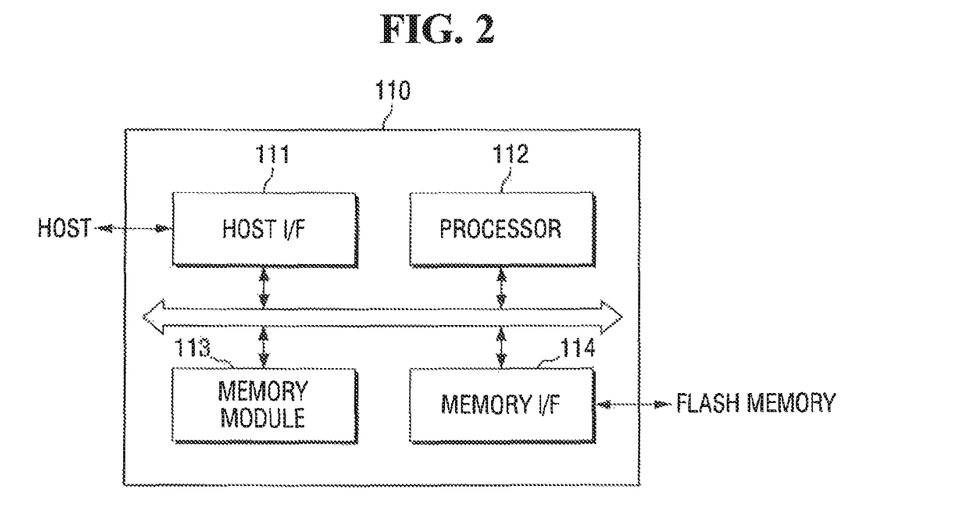
FIG. 2 is a block diagram illustrating a controller of a storage device shown in FIG. 1, according to an exemplary embodiment of the present inventive concept.

FIG. 1 is a block diagram illustrating a memory system according to an exemplary embodiment of the present inventive concept and FIG. 2 is a block diagram illustrating a controller of a storage device shown in FIG. 1, according to an exemplary embodiment of the present inventive concept.

Referring to FIG. 1, a memory system 1 according to an exemplary embodiment of the present inventive concept includes a host and a storage device 100.

The storage device 100 may include a flash memory 120 for storing data and a controller 110 for controlling the flash memory 120.

The controller 110 is connected to the host and the flash memory 120.

The controller 110 may access the flash memory 120 at a request from the host. For example, the controller 110 may control read, write, erase, and background operations of the flash memory 120.

The controller 110 provides interfacing between the flash memory 120 and the host. The controller 110 may drive firmware for controlling the flash memory 120.

The flash memory 120 is configured to include a plurality of memory cells to which data is written. The flash memory 120 may be, for example, a single level cell (SLC) memory in which one bit data is written to one memory cell, but exemplary embodiments of the present inventive concept are not limited thereto. The flash memory 120 may be, for example, a multi level cell (MLC) memory. For example, the flash memory 120 may be a large block NAND flash memory 120 whose block size is large (for example, 2 Kbytes can be stored in a page), which will be described later.

The flash memory 120 may include a memory cell array. The memory cell array may be configured to have a two-dimensional array structure or a three-dimensional array structure, but exemplary embodiments of the present inventive concept are not limited thereto. For example, the flash memory 120 may be provided in a vertical NAND flash memory cell array.

Referring to FIG. 2, the controller 110 may include a host interface (I/F) 111, a memory interface (I/F) 114, a memory module 113, and a processor 112.

The host I/F 111 may include a protocol to exchange data between the host and the controller 110. For example, the controller 110 may be configured to communicate with an external device (e.g., the host) through one of various interface protocols such as universal serial bus (USB), multimedia card (MMC), peripheral component interconnect (PCI), PCI-express (PCI-E), advanced technology attachment (ATA), serial-ATA (SATA), parallel-ATA (PATA), small computer small interface (SCSI), enhanced small disk interface (ESDI), and integrated drive electronics (IDE).

The memory I/F 114 may interface with the flash memory 120. Here, the memory I/F 114 may include, for example, a NAND interface.

The memory module 113 may be used as at least one of an operating memory of the processor 112, a cache memory between the flash memory 120 and the host, and a buffer memory between the flash memory 120 and the host. The memory module 113 may temporarily store data to be written to the flash memory 120 or data read from the flash memory 120. The memory module 113 may include, for example, static random access memory (SRAM), but exemplary embodiments of the present inventive concept are not limited thereto.

The processor 112 may control the overall operation of the controller 110.

Although not illustrated, the controller 110 may be configured to further include an error correction block. The error correction block may detect an error of data read from the flash memory 120 using an error correction code (ECC) and then correct the error.

As an example, the error correction block may be provided as a component of the controller 110. Alternatively, the error correction block may be provided as a component of the flash memory 120.

Further, although not illustrated, as an example, the host may include a host processor, and an interface module. In addition, the host may further include random access memory (RAM), read only memory (ROM), and other components.

The host processor controls the overall operation of the host. The host processor may transmit a write command, a read command, an erase command, etc. to the storage device 100 at a request from an application. The host processor may drive a file system for managing files stored in the storage device 100.

The interface module of the host may be used to communicate with the host I/F 111. For example, the host may be configured to communicate with an external device (e.g., the storage device 100) through one of various interface protocols such as USB, MMC, PCI, PCI-E, ATA, SATA, PATA, SCSI, ESDI, and IDE.

Figure 3:
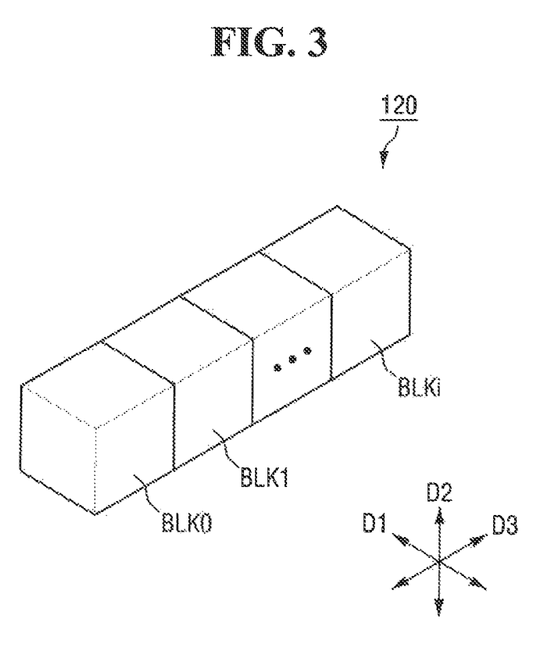
FIG. 3 is a diagram illustrating a flash memory of the storage device shown in FIG. 1, according to an exemplary embodiment of the present inventive concept.
Figure 4:
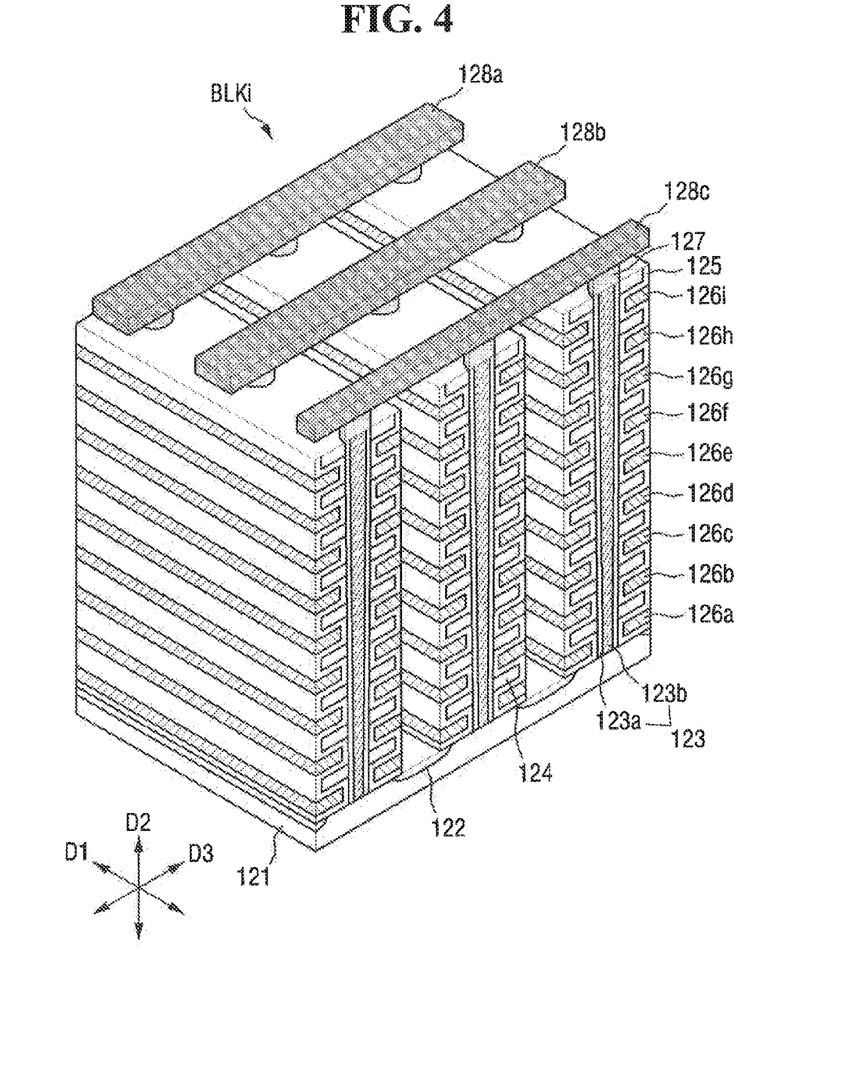
FIG. 4 is a perspective view illustrating a memory block shown in FIG. 3, according to an exemplary embodiment of the present inventive concept.

FIG. 3 is a diagram illustrating a flash memory of the storage device shown in FIG. 1, according to an exemplary embodiment of the present inventive concept, and FIG. 4 is a perspective view illustrating a memory block shown in FIG. 3, according to an exemplary embodiment of the present inventive concept.

Referring to FIG. 3, a memory cell array of the flash memory 120 may include a plurality of memory blocks BLK0 to BLKi, where i is a natural number. The respective memory blocks BLK0 to BLKi may extend in first to third directions D1, D2 and D3. The first to third directions D1, D2 and D3 may cross each other or may be different from each other, as shown in FIG. 3. For example, the first to third directions D1, D2 and D3 may cross each other at a right angle, but exemplary embodiments of the present inventive concept are not limited thereto.

Referring to FIG. 4, a memory block BLKi, where i is a natural number, may include a plurality of intermediate wiring structures 123, a plurality of interlayer insulating layers 124, a plurality of gate patterns 126a to 126i, a block layer 125 and a plurality of bit lines 128a to 128c, which are formed on a substrate 121.

A plurality of doped regions 122 may be provided on the substrate 121.

The plurality of interlayer insulating layers 124, spaced apart from each other in the second direction D2, may be sequentially stacked. As shown in FIG. 4, each of the plurality of interlayer insulating layers 124 may be formed lengthwise in the first direction D1. The interlayer insulating layers 124 may be made of oxide, but exemplary embodiments of the present inventive concept are not limited thereto.

Each of the intermediate wiring structures 123 may include an information storage pattern 123a, and channel patterns 123b. Flash memory cells may be defined at intersections between the channel patterns 123b and gate patterns 126a to 126i.

The channel patterns 123b are formed lengthwise in the second direction D2, and the plurality of gate patterns 126a to 126i are formed lengthwise in the first direction D1. In detail, the channel patterns 123b are arranged on the substrate 121 in forms of pillars and are formed to pass through the stacked plurality of interlayer insulating layers 124. The plurality of gate patterns 126a to 126i may be formed between each of the stacked plurality of interlayer insulating layers 124 and may be spaced apart from the Channel patterns 123b. The plurality of gate patterns 126a to 126i may cross the channel patterns 123b. In the illustrated embodiment, the plurality of gate patterns 126a to 126i have the same thickness. However, the plurality of gate patterns 126a to 126i may have different thicknesses from each other.

The channel patterns 123b may include, for example, a semiconductor material, such as single crystalline silicon, but exemplary embodiments of the present inventive concept are not limited thereto. The plurality of gate patterns 126a to 126i may include, for example, a conductive material, such as tungsten (W), cobalt (Co) or nickel (Ni), or a semiconductor material, such as silicon, but exemplary embodiments of the present inventive concept are not limited thereto.

The information storage pattern 123a may be formed on sidewalls of the channel patterns 123b). The information storage pattern 123a may be a stack of a tunnel layer and a trap layer. The tunnel layer and the trap layer may be disposed between the plurality of gate patterns 126a to 126i and the channel patterns 123b. In detail, the tunnel layer and the trap layer may be formed along the channel patterns 123b to pass through the plurality of interlayer insulating layers 124.

The tunnel layer, which is a region through which charges pass, may be formed of, for example, a silicon oxide layer, or may have a double layered structure including a silicon oxide and a silicon nitride layer.

The trap layer, which is a region in which the charges having passed through the tunnel layer are stored, may be formed of, for example, a nitride layer or a high-k layer. The nitride layer may include, for example, at least one of silicon nitride, silicon oxynitride, hafnium oxynitride, zirconium oxynitride, hafnium silicon oxynitride, and hafnium aluminum oxynitride. The high-k layer may include, for example, at least one of hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate.

The block layer 125 may be disposed between the channel patterns 123b and the plurality of gate patterns 126a to 126i. The block layer 125 may extend lengthwise in the first direction D1. In addition, the block layer 125 may be formed to have a zigzag configuration in the second direction D2.

The block layer 125 may be formed between the upper interlayer insulating layer 124 and each of the gate patterns 126a to 126i, between the lower interlayer insulating layer 124 and each of the gate patterns 126a to 126i, and between the channel patterns 123b (or the trap layer) and each of the gate patterns 126a to 126i. In other words, the block layer 125 may be conformally formed along the interlayer insulating layer 124 and the channel patterns 123b.

The block layer 125 may include a single layer or multiple layers. The block layer 125 may include a silicon oxide or an insulating metal oxide having a larger dielectric constant than silicon oxide. For example, the block layer 125 may include a high-k material, such as aluminum oxide, hafnium oxide, lanthanum oxide, tantalum oxide, titanium oxide, lanthanum hafnium oxide, lanthanum aluminum oxide, or dysprosium scandium oxide, or a combination layer of a stack of these materials. In the illustrated embodiment, the block layer 125 is composed of a single layer, but exemplary embodiments of the present inventive concept are not limited thereto. For example, the block layer 125 may be a stack of a silicon oxide and an aluminum oxide.

Further, the information storage pattern 123a and the block layer 125 shown in FIG. 4 are provided only for illustration. For example, the information storage pattern 123a and the block layer 125 may be disposed along the length of the channel patterns 123b.

The channel patterns 123b may be spaced apart from each other in the first direction D 1 and the third direction D3. In other words, the channel patterns 123b may be arranged in a matrix configuration. In FIG. 4, the channel patterns 123b are arranged in a 3×3 matrix, but exemplary embodiments of the present inventive concept are not limited thereto. Spaces may be formed in the plurality of interlayer insulating layers 124 between the channel patterns 123b arranged in the third direction D3.

A drain region 127 may be provided on the plurality of channel patterns 123b. The bit lines 128a to 128c may be connected to the plurality of channel patterns 123b through the drain region 127. The plurality of channel patterns 123b arranged in the third direction D3 may be electrically connected to each other by the bit lines 128a to 128c.

Figure 5:
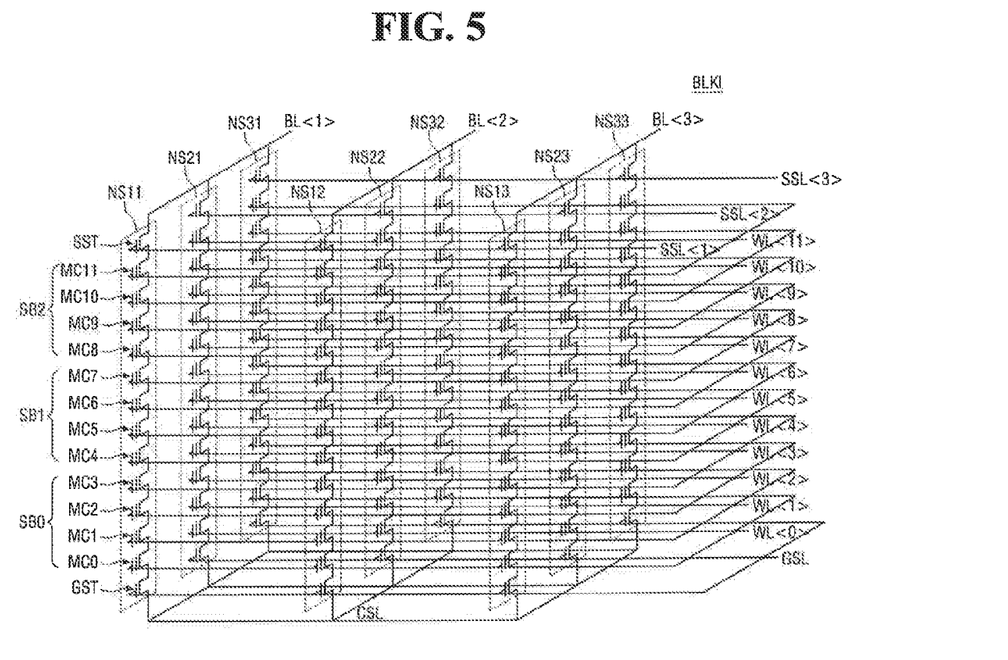
FIG. 5 is an equivalent circuit diagram illustrating a memory block shown in FIG. 3, according to an exemplary embodiment of the present inventive concept.

FIG. 5 is an equivalent circuit diagram illustrating a memory block shown in FIG. 3, according to an exemplary embodiment of the present inventive concept.

Referring to FIG. 5, cell strings NS11 to NS 33 are formed between bit lines BL<1>, BL<2> and BL<3> and a common source line CSL.

Specifically, the cell strings NS11, NS21 and NS31 are formed between the first bit line BL<1> and the common source line CSL. The cell strings NS12, NS22 and NS32 are formed between the second bit line BL<2> and the common source line CSL. The cell strings NS13, NS23 and NS33 are formed between the third bit line BL<3> and the common source line CSL. The first to third bit lines BL<1> to BL<3> may correspond to the bit lines 128a to 128c shown in FIG. 4, respectively.

A string select transistor SST of each of the cell strings NS11 to NS33 is connected to a corresponding one of the bit lines BL<1> to BL<3>. A ground select transistor GST of each of the cell strings NS11 to NS33 is connected to the common source line CSL. Memory cells MC0 to MC11 are provided between the string select transistor SST and a ground select transistor GST of each of the cell strings NS11 to NS33.

In the following description, the cell strings NSs are defined in units of rows and columns. The cell strings NSs commonly connected to one bit line constitute a column. For example, the cell strings NS11, NS21 and NS31 connected to the first bit line BL<1> may correspond to a first column. The cell strings NS12, NS22 and NS32 connected to the second bit line BL<2> may correspond to a second column. The cell strings NS13, NS23 and NS 33 connected to the third bit line BL<3> may correspond to a third column.

Each of the cell strings NSs includes one of the ground select transistors GSTs. The ground select transistors GSTs may be controlled by a single ground select line GSL. Although not illustrated, cell strings corresponding to respective rows may be controlled by different ground select lines.

The memory cells MCs corresponding to the same semiconductor layer share a word line WL. A memory cell MC0 of each of the cell strings NS11 to NS33 may be connected to the word line WL<0>. In addition, the cell strings NSs of the same row share a string select line SSL. The cell strings NSs of different rows are connected to different string select lines SSL<1>, SSL<2> and SSL<3>, respectively. The common source line CSL is commonly connected to the cell strings NSs. For example, the plurality of doped regions 122 shown in FIG. 4 may be connected to each other to constitute the common source line CSL.

A selected memory block BLKi may be divided into a number of sub-blocks SB0, SB1 and SB2 smaller than each of the plurality of memory blocks BLK0 to BLKi. The sub-blocks SB0, SB1 and SB2 may be divided in a word line direction. Each sub-block in the memory block BLKi is erased independently of the other sub-blocks, irrespective of the basis on which the sub-blocks are divided.

As an example, the sub-block SB0 may include memory cells connected to the word lines WL<0>, WL<1>, WL<2>, WL<3>, among the memory cells included in the memory block BLKi. The sub-block SB1 may include memory cells connected to the word lines WL<4>, WL<5>, WL<6> and WL<7>, among the memory cells included in the memory block BLKi. The sub-block SB2 may include memory cells connected to the word lines WL<8>, WL<9>, WL<10> and WL<11>>, among the memory cells included in the memory block BLKi. The memory cells included in the sub-block SB0 may be selected independently of the other sub-blocks SB1 and SB2 to then be erased. In other words, one or two or more of the sub-blocks SB0, SB1 and SB2 may be concurrently selected and erased. Thus, the flash memory 120 is able to supply a bias voltage for erasing the memory cells in units of sub-blocks SBs.

A method of dividing sub-blocks defined in one memory block BLKi is exemplified in FIG. 5, but the present inventive concept does not limit the sub-blocks to be divided as that exemplified in FIG. 5. In other words, while one memory block BLKi divided into three sub-blocks is exemplified in FIG. 5, it may also be divided into two or more than four sub-blocks. In addition, one sub-block SB may include two or three word lines. Alternatively, one sub-block SB may include five or more word lines.

Further, although not illustrated, the memory block BLKi may be divided into a number of pages smaller than the plurality of sub-blocks SB0, SB1 and SB2. The respective pages may be divided in a word line direction, and each page may be erased in the memory block BLKi independently of the other pages.

As an example, each page may include memory cells connected to the same word line among the memory cells included in the memory block BLKi. The memory cells included in each page may be selected independently of the other pages to then be erased. In other words, one or two or more of the pages may be concurrently selected and erased. Thus, the flash memory 120 is able to supply a bias voltage for erasing the memory cells in units of pages.

A method of dividing pages defined in one memory block BLKi is exemplified in the above-described embodiment, but the present inventive concept does not limit the pages to be divided as that exemplified in the above-described embodiment. Alternatively, one page may include two or more pages.

Figure 6:
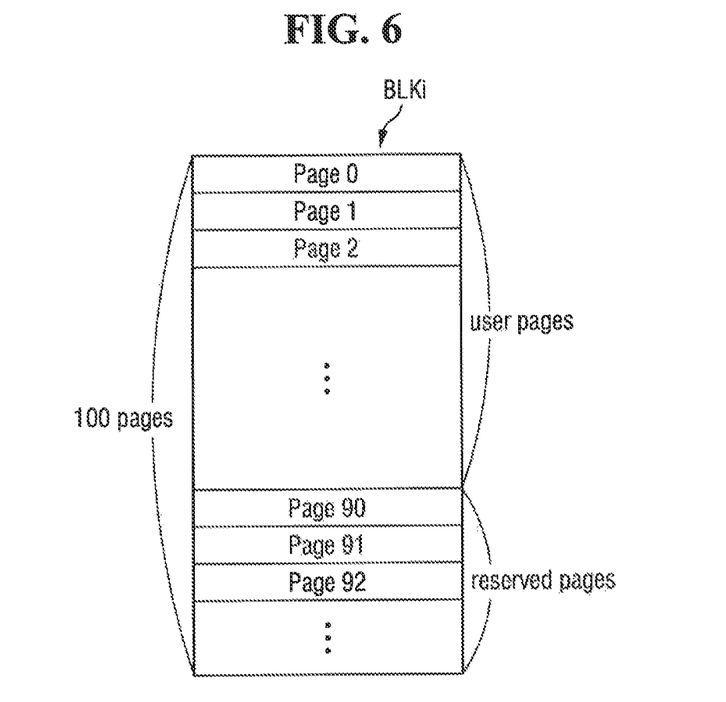
FIG. 6 illustrates a memory block structure of a storage device of the memory system shown in FIG. 1, according to an exemplary embodiment of the present inventive concept.
Figure 7:
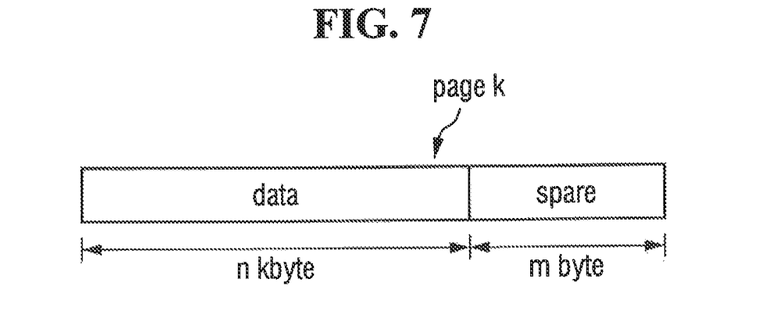
FIG. 7 illustrates a page structure of the memory block structure shown in FIG. 6, according to an exemplary embodiment of the present inventive concept.

FIG. 6 illustrates a memory block structure of a storage device of the memory system shown in FIG. 1, according to an exemplary embodiment of the present inventive concept, and FIG. 7 illustrates a page structure of the memory block shown in FIG. 6, according to an exemplary embodiment of the present inventive concept.

Referring to FIG. 6, each block BLKi may include a plurality of pages, each page including a plurality of memory cells. As an example, each BLKi may include 100 pages, but exemplary embodiments of the present inventive concept are not limited thereto.

The pages may be divided into a free page, a valid page, and an invalid page. No data is stored in the free page, and new data may be written thereto. Updated data is stored in the valid page, and data not yet updated (e.g., garbage) is stored in the invalid page. The valid page and the invalid page may be distinguished from each other according to whether the stored data can additionally be used (e.g., read) or not.

Each block BLKi may include user pages and reserved pages. As an example, 90 pages of each block BLKi may be allocated as a user page area and 10 pages of each block BLKi may be allocated as a reserved page area, but exemplary embodiments of the present inventive concept are not limited thereto.

The current embodiment of the present inventive concept will be described with regard to a case where an allocation ratio of the reserved page area is 10% by way of example.

The user page area may be a space for storing user data and the reserved page area may be, for example, an over-provisioning space secured to perform a background operation of a flash translation layer (FLT). Thus, the reserved page area includes free pages only. The user page area is provided to a user, for example, a file system, while the reserved page area is not provided to the file system. According to the current embodiment of the present inventive concept, the over-provisioning space is allocated to each block in units of pages.

The controller 110 may manage pages of the memory cell array using a virtual address. As an example, virtual addresses corresponding to the blocks of the memory cell array may be allocated to the blocks. The virtual address allocated to each block may be referred to as a virtual block address. The controller 110 may manage the block by mapping an externally supplied logical block address and the virtual block address. The mapping of the logical block address to the virtual block address may be managed through firmware of the controller 110, for example, an FTL. The FTL may perform a background operation, for example, wear leveling or garbage collection, but exemplary embodiments of the present inventive concept are not limited thereto.

A log block is a block to which data is written at a request from the host and a virtual block address is mapped. The current embodiment of the present inventive concept will be described assuming that all blocks of the memory cell array are used as log blocks, but exemplary embodiments of the present inventive concept are not limited thereto.

As another example, the controller 110 may manage pages of the memory cell array using virtual addresses. Virtual addresses corresponding to the pages may be allocated to the pages.

Referring to FIG. 7, each page Pagek, Where k is a natural number, may include a plurality of memory cells for storing data. The plurality of memory cells may be divided into a data area and a spare area. The data area may be an n Kbyte area, and the spare area may be an m byte area. As an example, the data area may be 2 Kbytes and the spare area may be 64 bytes, but exemplary embodiments of the present inventive concept are not limited thereto.

User data may be stored in the data area, and management information of the data area may be stored in the spare area. For example, bad block indicator information, an ECC, and metadata of pages may be stored in the spare area, but exemplary embodiments of the present inventive concept are not limited thereto. Here, the metadata represents page management information. In the following description, the metadata representing page management information will be briefly referred to as "meta" to be distinguished from user data.

As an example, the data area and the spare area may be divided in one page. As another example, the data area and the spare area may be divided into units of blocks. As still another example, the data area and the spare area may exist together in the storage space of the flash memory 120.

Alternatively, the bad block indicator information, the ECC, the metadata of pages, or the like, may be stored in the memory module 113 of the controller 110.

Although not illustrated, the flash memory 120 may further include components for accessing the memory cell array, for example, a row decoder circuit, a read/write circuit, a control logic, a voltage generator, a column decoder circuit, an input/output interface, and so on.

The flash memory 120 has an erase-before-write characteristic. To write data to a particular page of the flash memory 120, it is necessary to erase a block including the particular page before performing a write operation because a write operation of the flash memory 120 is generally performed in units of pages and an erase operation is performed in units of blocks.

A general flash memory manages a user block area and a reserved block area in units of blocks. Here, the user block area is a space for storing user data and the reserved block area may be, for example, an over-provisioning space secured to perform a background operation of an FTL. The user block area is provided to a user, for example, a file system, while the reserved page area is not provided to the file system.

In the general flash memory 120, if free blocks of the user block area are insufficient due to the presence of a had block, free blocks of the reserved block area are allocated to the user block area. Here, since the free blocks of the reserved block area are allocated in units of a block (or two or more blocks), a larger storage space than required may be allocated. In addition, the free blocks of the reserved block area may also become insufficient relatively rapidly. Thus, the FTL performs a background operation, such as garbage collection, to secure free blocks.

In the garbage collection, a specific block is selected from the memory cell array, a valid page of the specific block is copied to a free block, and the specific block is erased to then become a free block. The erased block may be used when data is to be later written.

However, according to the management method of the storage space of the flash memory 120, write performance of the flash memory (in particular, the flash memory 120 having a large sized block) is lowered, and this may adversely affect the block's operation.

In the current embodiment of the present inventive concept, it is assumed that an erase operation of the flash memory 120 is performed in units of at least one page. Therefore, the over-provisioning space of the flash memory 120 may be allocated to each block in units of pages, as described above.

In the current embodiment of the present inventive concept, if garbage collection is necessary, as will later be described, compaction is performed using free pages of the reserved page area. Accordingly, a compaction cost is associated with only copying of data without erasing a block, thereby not adversely affecting the block's operation and efficiently managing the storage space of the flash memory 120.

Referring again to FIG. 1, the controller 110 and the flash memory 120 may be integrated into one semiconductor device. As an example, the controller 110 and the flash memory 120 may be integrated into one semiconductor device to form a memory card. For example, the controller 110 and the flash memory 120 may be integrated into one semiconductor device to form a Multi Media Card (MMC), reduced size (RS)-MMC, MMCmicro), a Secure Digital (SD, miniSD, microSD) card, a Universal Flash storage (UFS), a PC card (originally personal computer memory card international association (PCMCIA) or PCMCIA card), a Compact Flash (CF) card, a Smart Media (SM) card, a memory stick, and the like, but the present inventive concept is not limited thereto.

As another example, the controller 110 and the flash memory 120 may be integrated into one semiconductor device to form a Solid State Disk/Drive (SSD). The SSD may include a storage device configured to store data in a semiconductor memory.

Further, the memory system 1 may comprise or be incorporated in a computer, a portable computer, an ultra mobile personal computer (UMPC), a work station, a net-book, a personal digital assistant (PDA), a portable computer, a web tablet, a wireless phone, a mobile phone, a smart phone, an e-book, a portable multimedia player (PMP), a potable game console, a navigation device, a black box, a digital camera, a three-dimensional television, a digital audio recorder, a digital audio player, a digital picture recorder, a digital picture player, a digital video recorder, a digital video player, a device capable of transmitting/receiving information in wireless environments, one of various electronic devices constituting a home network, one of various electronic devices constituting a computer network, one of various electronic devices constituting a telematics network, radio frequency identification (RFID) devices, or embedded systems, but the present inventive concept is not limited thereto.

Further, as an example, the flash memory 120, the storage device 100, or the memory system 1 may be packaged in a variety of ways. For example, the flash memory 120, the storage device 100, or the memory system 1 may be mounted in a package on package (PoP), a ball grid array (BGA) package, a chip scale package (CSP), a plastic leaded chip carrier (PLCC), a plastic dual in-line package (PDIP), a die in waffle pack, a die in wafer form, a chip-on-board (COB), a ceramic dual in-line package (CERDIP), a plastic metric quad flat pack (MQFP), a thin quad flatpack (TQFP), a small outline integrated circuit (SOIC), a shrink small outline package (SSOP), a thin small outline package (TSOP), a thin quad flatpack (TQFP), a system in package (SIP), a multi-chip package (MCP), a wafer-level fabricated package (WFP) or a wafer-level processed stack package (WSP).

Figure 8:
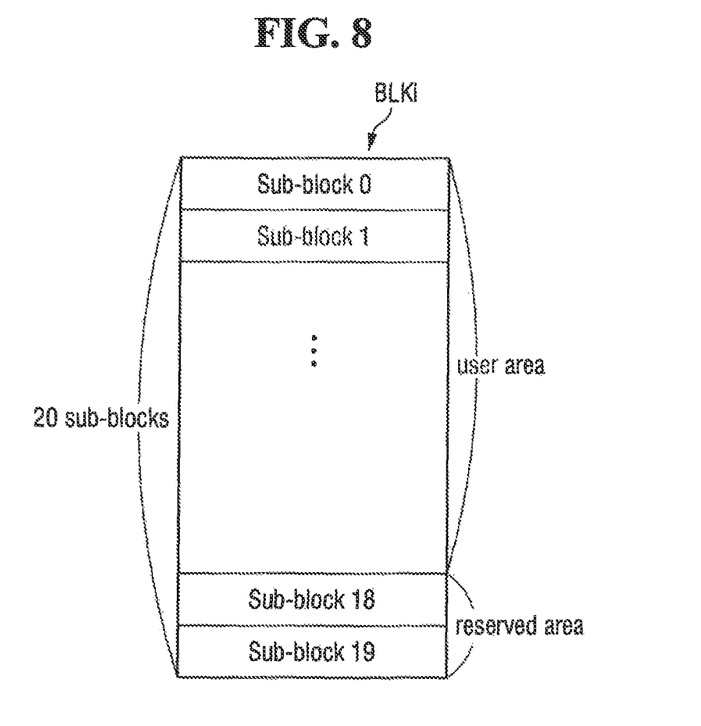
FIG. 8 illustrates a memory block structure of a storage device of a memory system according to an exemplary embodiment of the present inventive concept.

FIG. 8 illustrates a memory block structure of a storage device of a memory system according to an exemplary embodiment of the present inventive concept. For the sake of convenience, the following description will focus on differences between the memory block structures shown in FIGS. 6 and 8.

Referring to FIG. 8, each block BLKi may include a plurality of sub-blocks. As an example, each BLKi may include 20 sub-blocks, but exemplary embodiments of the present inventive concept are not limited thereto. Each sub-block may include 5 pages, but exemplary embodiments of the present inventive concept are not limited thereto.

Each block BLKi may include a user area and a reserved area. As an example, 18 sub-blocks of each block BLKi may be allocated as a user area and 2 sub-blocks of each block BLKi may be allocated as a reserved area, but exemplary embodiments of the present inventive concept are not limited thereto. The current embodiment of the present inventive concept will be described with regard to a case where an allocation ratio of the reserved area is 10% by way of example.

The user area is a space for storing user data, which is substantially the same as the user page area shown in FIG. 6, and the reserved area is an over-provisioning space secured for performing a background operation of the FTL, which is substantially the same as the reserved page area shown in FIG. 6. Thus, the reserved area consists of free pages only. The user area is provided to a user, for example, a file system, while the reserved area is not provided to the file system. According to an exemplary embodiment of the present inventive concept, the over-provisioning space is allocated to each block in units of sub-blocks.

In an exemplary embodiment of the present inventive concept, it is assumed that an erase operation of the flash memory 120 is performed in units of sub-blocks. Therefore, the over-provisioning space of the flash memory 120 may be allocated to each block in units of sub-blocks as described above.

In an exemplary embodiment of the present inventive concept, if garbage collection is necessary, as will later be described, compaction is performed using free sub-blocks of the reserved area.

Hereinafter, an operating method of the memory system shown in FIGS. 9 and 10 will be described. In the following, repeated descriptions will not be given.

Figure 9:
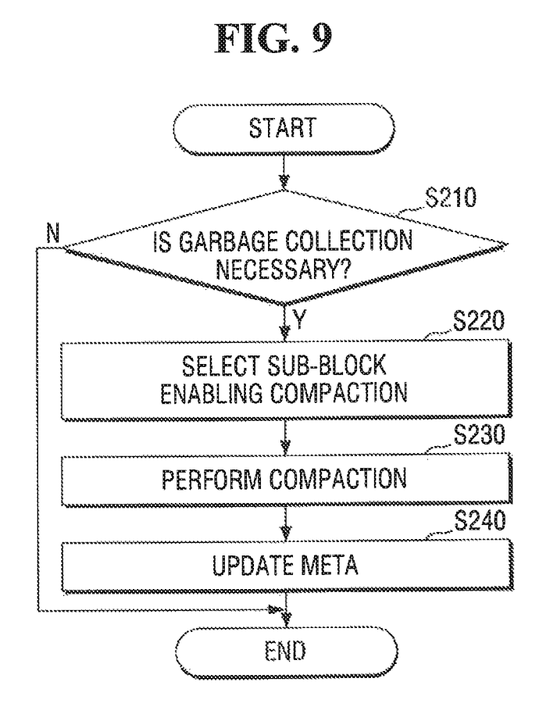
FIG. 9 is a flowchart illustrating erase operations of a memory system according to an exemplary embodiment of the present inventive concept.
Figure 10:
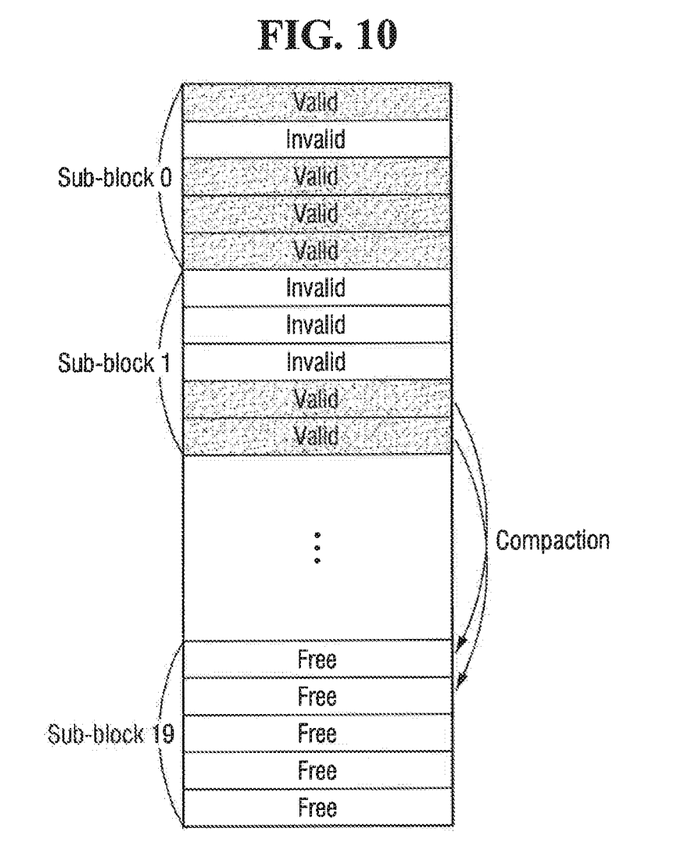
FIG. 10 is a flowchart illustrating compaction in the operating method of the memory system shown in FIG. 9, according to an exemplary embodiment of the present inventive concept.

FIG. 9 is a flowchart illustrating an operating method of a memory system according to an exemplary embodiment of the present inventive concept, and FIG. 10 illustrates compaction in the operating method of the memory system according to an exemplary embodiment of the present inventive concept shown in FIG. 9.

Referring to FIG. 9, the controller 110 determines whether garbage collection is necessary or not (S210). When a number of sub-blocks of the reserved area is smaller than a reference number, for example, 1, the controller 110 may determine that garbage collection is necessary.

Next, if it is determined that garbage collection is necessary, the controller 110 selects a sub-block enabling compaction (S220).

Referring to FIG. 10, since a second one, e.g., sub-block 1, of the plurality of sub-blocks of the user area consists of three invalid pages and two valid pages, it can be selected as a sacrificial sub-block.

Next, the controller 110 may perform compaction (S230).

Referring again to FIG. 10, the controller 110 copies the data of the valid page of the second sub-block, e.g., sub-block 1, of the user area to a free page of a $20^{th}$ sub-block, e.g., sub-block 19, of the reserved area without erase intervention. Thereafter, the controller 110 may erase the second sub-block, e.g., sub-block 1.

According to the current embodiment of the present inventive concept, since compaction is performed in each block when garbage collection is executed, a full block merge operation can be avoided. Unlike the compaction, the full block merge operation requires an erase operation to secure free blocks in advance. In other words, an erasing cost is additionally incurred in the cost of the full block merge operation. In the current embodiment of the present inventive concept, free pages are allocated to sub-blocks of the reserved area, and thus the full block merge operation can be avoided.

Next, the controller 110 updates meta (S240). The controller 110 writes the meta to incorporate the $20^{th}$ sub-block, e.g., sub-block 19, into the user area, and incorporates the erased second sub-block, e.g., sub-block 1, into the reserved area.

Further, the memory system can be operated by replacing sub-blocks with pages in substantially the same manner as shown in FIGS. 9 and 10.

Figure 11:
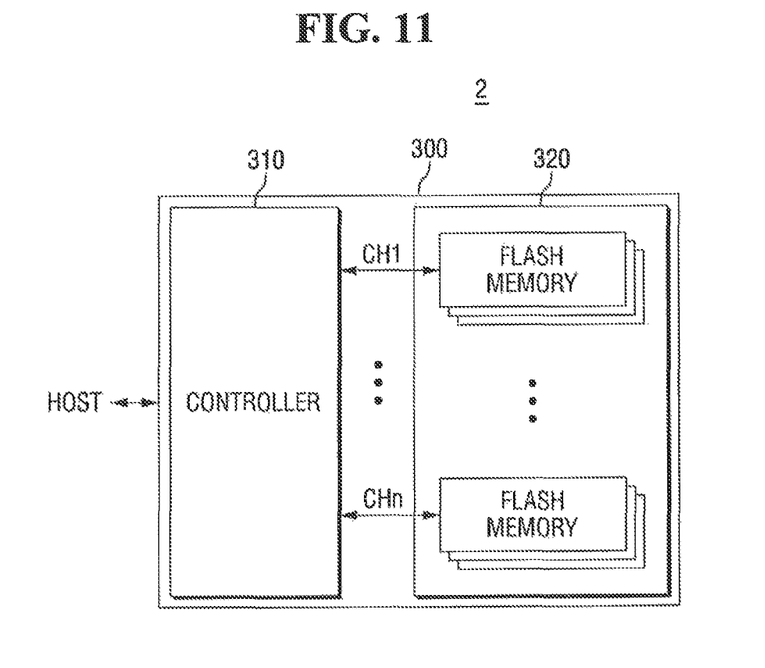
FIG. 11 is a block diagram illustrating an application example of a memory system according to an exemplary embodiment of the present inventive concept.

FIG. 11 is a block diagram illustrating an application example of a memory system according to an exemplary embodiment of the present inventive concept.

Referring to FIG. 11, a memory system 2 includes a storage device 300 and a host 200.

The storage device 300 includes a plurality of flash memory chips 320. The plurality of flash memory chips 320 are divided into a plurality of groups. Each group of the plurality of flash memory chips 320 is configured to communicate with a controller 310 through a common channel. For example, the plurality of flash memory chips 320 may communicate with the controller 310 through first to nth channels CH1 to CHn.

Each of the flash memory chips 320 may be configured in the same manner as the flash memory 120 shown in FIGS. 1 to 5.

While the plurality of flash memory chips 320 connected to one channel are exemplified in FIG. 11, the memory system 2 may be modified to connect one flash memory chip to one channel.

Figure 12:
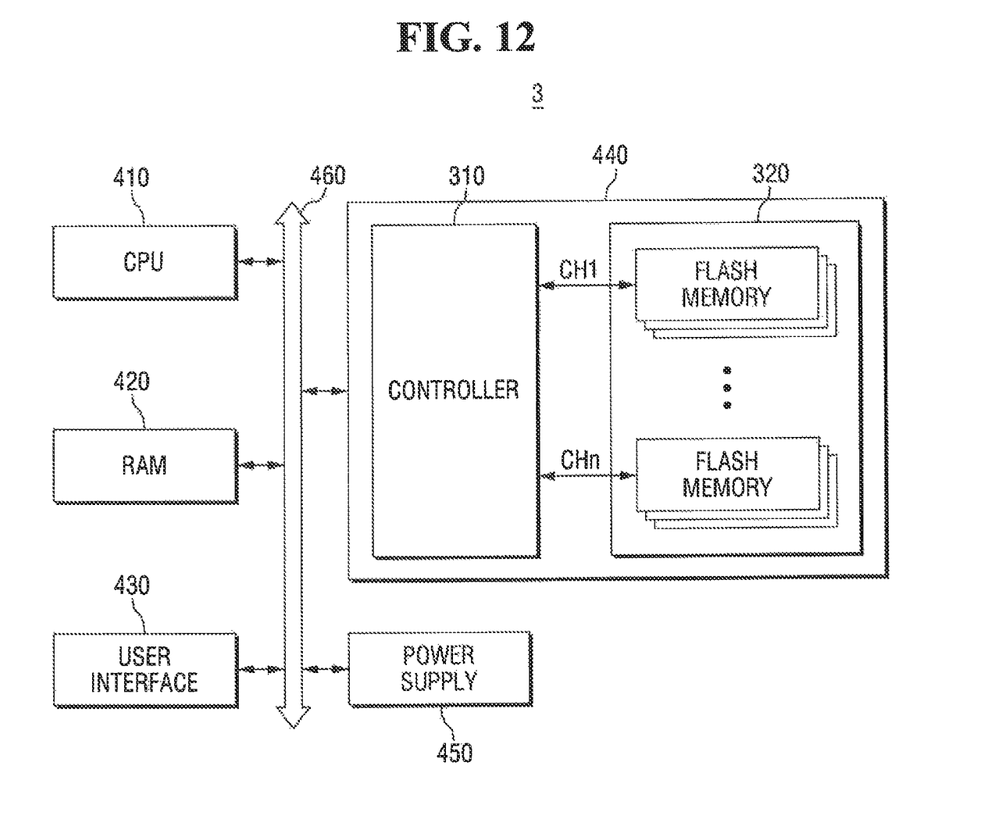
FIG. 12 is a block diagram illustrating a computing system including the memory system shown in FIG. 11, according to an exemplary embodiment of the present inventive concept.

FIG. 12 is a block diagram illustrating a computing system including the memory system shown in FIG. 11, according to an exemplary embodiment of the present inventive concept.

Referring to FIG. 12, a computing system 3 includes a central processing unit (CPU) 410, a RAM 420, a user interface 430, a power supply 450, and a memory system 440.

The memory system 440 may be electrically connected to the CPU 400, the RAM 400, the user interface 430 and the power supply 450 through a system bus 460. The data supplied through the user interface 430 or processed by the CPU 410 may be stored in the memory system 440.

In FIG. 12, a plurality of flash memories 320 are connected to the system bus 460 through the controller 310. However, the plurality of flash memories 320 may be configured to be directly connected to the system bus 460.

The memory system 2 shown in FIG. 11 is provided in the computing system 3 exemplified in FIG. 12. However, the memory system may be replaced with the memory system 1 shown in FIG. 1.

As an example, the computing system 3 may be configured to have both of the memory systems 1 and 2 shown in FIGS. 1 and 11, respectively.

While the present inventive concept has been particularly shown and described with reference to exemplary embodiments thereof, it will be understood by those of ordinary skill in the art that various changes in form and detail may be made therein without departing from the spirit and scope of the present inventive concept as defined by the following claims.

What is claimed is:

1. A memory system, comprising;
a three-dimensional (3D) flash memory including a block having first sub-blocks and second sub-blocks different from each other, the second sub-blocks including free pages only; and
a controller configured to access one of the first sub blocks that includes data and copy data of a valid page of the accessed first sub-block to at least one of the free pages of one of the second sub-blocks in a garbage collection operation, and then, erase the first sub-block having the data of the valid page copied therefrom.

2. The memory system of claim 1, wherein if the number of the second sub-blocks is smaller than a reference number, the garbage collection operation is performed.

3. The memory system of claim 1, wherein the block has a first area including the first sub-blocks and a second area including the second sub-blocks, and the controller is configured to write metadata to the first area by incorporating the second suls-block having the data of the valid page copied thereto into the first area.

4. The memory system of claim 1, wherein the block has a first area including the first sub-blocks and a second area including the second sub-blocks, and the controller is configured to write metadata by incorporating the erased first sub-block into the second area.

5. The memory system of claim 1, wherein each of the first sub-blocks or each of the second sub-blocks includes at least one page.

6. The memory system of claim 1, wherein the first sub-blocks are provided to a file system and the second sub-blocks are not provided to the file system.

7. A memory system, comprising:
a three-dimensional (3D) flash memory including a plurality of blocks; and
a controller configured to store data in the 3D flash memory, wherein at least one of the plurality of blocks includes a first area provided to a file system and a second area not provided to the file system,
wherein the first area includes first sub-blocks including valid pages and invalid pages, and the second area includes second sub-blocks including free pages only,
wherein the controller is configured to copy data of at least one of the valid pages to at least one of the second sub-blocks to perforin garbage collection and then erase the first sub-block that had the data of the at least one valid page copied therefrom.

8. The memory system of claim 7, wherein if the number of the second sub-blocks is smaller than a reference number, the garbage collection is performed.

9. The memory system of claim 7, wherein the controller is configured to write metadata to the first area by incorporating the second sub-block having the data of the valid page copied thereto into the first area and incorporating the erased first sub-block into the second area.

10. The memory system of claim 7, wherein each of the first sub-blocks or each of the second sub-blocks includes at least one page.

11. The memory system of claim 7, wherein the controller is configured to erase the 3D flash memory in units of at least one page.

12. A memory system, comprising:
a three-dimensional (3D) flash memory including first sub-blocks and second sub-blocks, at least one of the first sub-blocks including valid and invalid pages and at least one of the second sub-blocks includes free pages only; and
a controller configured to copy data of a valid page of at least one of the first sub-blocks, to the at least one second sub-block in a garbage collection operation,
wherein the at least one first sub-block is erased after the data is copied therefrom.

13. The memory system of claim 12, wherein the first sub-blocks each include a plurality of pages, or the second sub-blocks each include a plurality of pages.

14. The memory system of claim 12, wherein the first sub-blocks are part of a user area and the second sub-blocks are part of a reserved area.

15. The memory system of claim 14, wherein the controller is configured to incorporate that at least one second sub-block into the user area and the at least one first sub-block into the reserved area.

* * * * *